United States Patent [19]

Pease

[11] 3,746,968

[45] July 17, 1973

[54] AMPLITUDE-TO-FREQUENCY CONVERTER

[75] Inventor: Robert A. Pease, Wilmington, Mass.

[73] Assignee: Teledyne, Inc., Los Angeles, Calif.

[22] Filed: Sept. 8, 1972

[21] Appl. No.: 287,575

[52] U.S. Cl. ........................ 321/60, 330/69, 330/82
[51] Int. Cl. ........................ H02m 5/00, 321 60;18
[58] Field of Search ........................ 330/69, 82

[56] References Cited

UNITED STATES PATENTS 3,356,961 12/1967 Sedlmeyer ........................ 330/69

OTHER PUBLICATIONS

Schick, Larry L., "Linear Circuit Applications of Operational Amplifiers," IEEE Spectrum, April, 1971, pp. 36–50.

*Primary Examiner*—William M. Shoop, Jr.
*Attorney*—Robert J. Schiller et al.

[57] ABSTRACT

An amplitude-to-frequency converter is described which uses a single operational amplifier having both regenerative and degenerative feedback loops. The degenerative feedback loop includes a diode and capacitor in series, the inverting input of the amplifier is shunted to ground through an input capacitor. The output of the amplifier is connected to ground through a bilateral voltage limiting circuit. The amplifier will provide a rectangular wave output at a repetition rate linearly related to the amplitude of the input signal, the only precision values required being supplied by the voltage limiting circuit and the degenerative feedback capacitors.

9 Claims, 3 Drawing Figures

AMPLITUDE-TO-FREQUENCY CONVERTER

Figure 1:
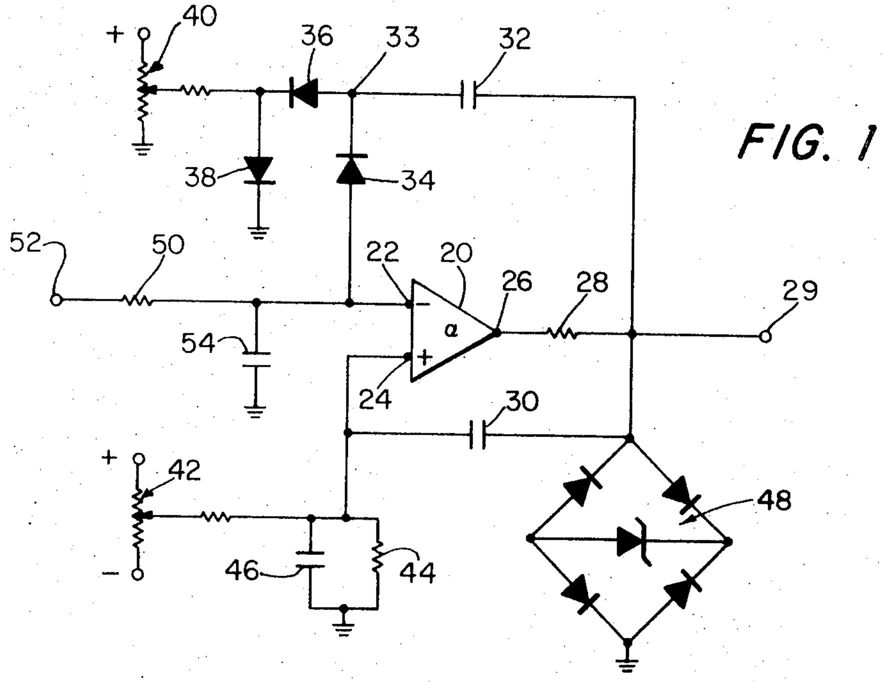

The present invention relates to analog value-to-pulse rate conversion and more particularly to a highly linear voltage-to-pulse rate converter.

A large number of devices are known in the art in which an analog parameter such as a voltage or current is converted to a frequency or pulse rate. One form of such device is known as a voltage controlled oscillator which typically generates a sinusoidal wave form at a frequency directly proportional to the amplitude of some substantially DC input voltage level. Where, for example, it is desirable to use such devices in digital circuitry (for digital volt meters, indirect analog-digital converters and the like) it is preferred that the output be in the form of rectangular pulses rather than a sinusoidal wave, and that the output pulse rate be highly linear with respect to the amplitude of the input voltage. Such voltage-to-pulse rate converters are known and are typified by the well known dual-slope integration system. The latter employs a large number of expensive components, including a ramp generator, a clocking oscillator and a number of gates and flip-flops, and is therefore quite complex and relatively expensive.

It is known to employ unijunction transistors (UJT) in prior art voltage-to-pulse rate converters in order to minimize the circuit costs. However, most UJT oscillators short out the incoming signal during the time they are firing, and only the rise rate is proportional to the signal. Such UJT oscillators also have poor tolerance and temperature characteristics. In many UJT circuits, as the fraction of the cycle spent on discharging the capacitors becomes significant, the accuracy will tend to fall off.

A principal object of the present invention is therefore to provide an improved voltage-to-pulse rate converter. Other objects of the present invention are to provide such a converter in which because the number of parts is minimized, the converter is therefore relatively inexpensive; to provide such a converter having high linear relationship between the input signal amplitude and the output repetition rate; and to provide such a circuit which uses as its sole active element a simple operational amplifier.

To effect the foregoing and other objects, generally the present invention comprises a differential operational amplifier having a regenerative capacitive feedback path, a negative integrating feedback path which is unipolar and a bilateral voltage limiter connected to the output of the amplifier.

Other objects will in part appear obvious and will in part appear hereinafter. The invention accordingly comprises the apparatus possessing the construction, combination of elements, and the arrangement of parts as are exemplified in the following detailed disclosure and the scope of the application of which will be indicated in the claims.

Figure 2:
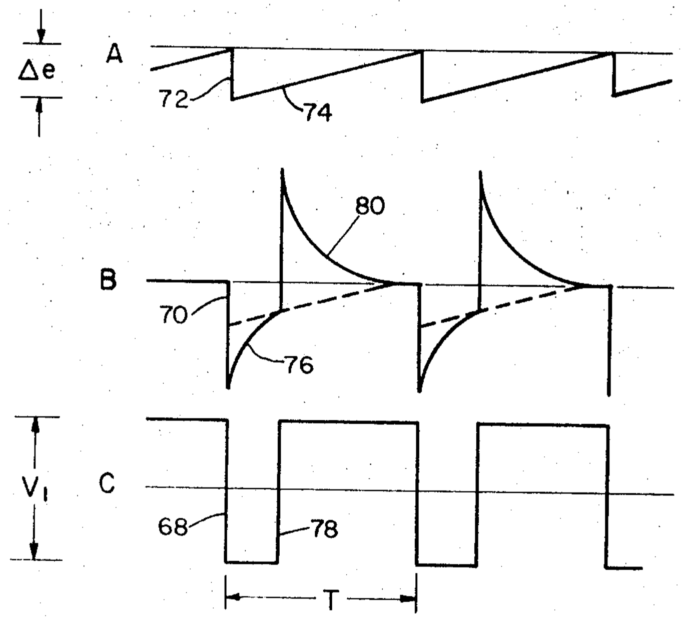
Figure 3:
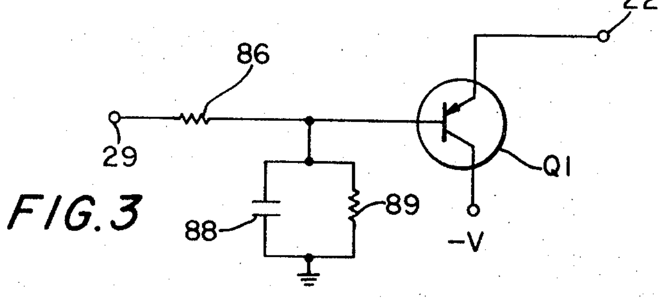

For a fuller understanding of the nature and the objects of the present invention, reference should be had to the following detailed description taken in connection with the accompanying drawing wherein:

FIG. 1 is a schematic circuit diagram embodying the principles of the present invention;

FIG. 2 illustrates a number of idealized waveforms on a common time axis, useful in describing the operation of the emobdiment of FIG. 1, A being the voltage at the inverting input of the amplifier of the device of FIG. 1, B being the voltage at the non-inverting input of that amplifier, and C being the voltage at the output of that amplifier; and FIG. 3 is a schematic circuit diagram showing a startup circuit for use with the embodiment of FIG. 1.

Referring now to FIG. 1 there is shown a converter embodying the principles of the present invention and including a single, differential, very high gain (e.g., > 1,000) amplification stage 20 having a negative or inverting input terminal 22 and a positive or non-inverting input terminal 24. Output terminal 26 of stage 20 is connected through an output impedance, such as resistor 28, to system output terminal 29. Terminal 29 is connected through a regenerative feedback path, including capacitor 30, back to input terminal 24. Similarly, there is provided a unilateral current-conducting, negative feedback path from the output terminal 29 to input terminal 22, and comprising series connected feedback capacitor 32 and first diode 34. Diode 34 is typically poled such that its anode is connected to terminal 22 and its cathode coupled to capacitor 32. Junction 33 of diode 34 and capacitor 32 is connected through resistor 36 to the adjustable tap on potentiometer 40. Potentiometer 40 is preferably connected between a positive voltage source and ground. Junction 33 is connected to the anode of second diode 38, the cathode of the latter being connected to ground.

Terminal 24 is connected also to the adjustable tap on a second potentiometer 42, the latter typically being connected between positive and negative terminals of a source of voltage. Terminal 24 is also connected through resistor 44 to ground, capacitor 46 being provided in parallel to resistor 44.

Lastly, output terminal 29 is connected to a bilateral voltage limiting device such as a zener diode bridge 48 connected between terminal 29 and ground. Bridge 48 is the usual type of diode bridge well known to those skilled in the art, employing four ordinary diodes and a single zener diode in a bridge configuration. Alternatively, one could employ a pair of back-to-back zener diodes in place of bridge 48 or even tap terminal 29 into the junction of a pair of diodes respectively connected to positive and negative voltage sources. The basic criterion required for the bilateral voltage limiting device is that it set accurate limits on the peak-to-peak voltages which can exist at terminal 29, and while it is preferably symmetrical voltage limiter, it need not however, be so.

Lastly, it will be seen that input terminal 22 is connected through input resistor 50 to system input terminal 52 and is also connected through input shunt capacitor 54 to ground.

It will also be apparent that certain modifications can be made in the circuit as shown without materially effecting its operation. For example, one may substitute grounded base transistors for at least diodes 34 and 38. In addition, one can substitute other small voltage sources for potentiometers 40 and 42. It will also be recognized that where the device is to be used as a current-to-frequency converter, one can omit the provision of input registor 50, and instead feed the current being converted directly into junction 22.

In the preferred embodiment, the ratio of the values of input capacitor 54 to feedback capacitor 32 is preferably in excess of 1,000/1 inasmuch as that ratio determines the dynamic range for the input signals. It is particularly desirable also that capacitor 54 be of quite high value so it will serve to minimize the effect at input junction 22 of ripple in the input signal at system terminal 52. While capacitor 54 should have a high capacitance, it need not be of high precision.

The device of FIG. 1 operates, with reference to the timing diagram of FIG. 2, upon application of some DC or quasi-steady-state positive voltage $e_t$ at terminal 52. This serves to cause a current to flow through input resistor 50 to the negative input 22 of amplifier 20. Obviously, the current flowing can only be as precise as the value of resistor 50; hence where the device is used as a voltage-to-frequency converter, it is preferred that resistor 50 be a precision resistor. For reasons adduced herein later, one can assume that, as shown in FIG. 2A, the voltage at junction 22 starts at some negative value and therefore tends to ramp through ground value as the current through resistor 50 discharges input capacitor 54 from its initial negative potential to ground and toward the positive voltage $e_t$.

Until the voltage at terminal 22 reaches zero (neglecting offsets), the output voltage at terminal 29 is limited and held at some positive value $V_1$, the voltage set by bridge 48. When the voltage at terminal 22 reaches such zero, the voltage at output terminal 29 will swing abruptly to a negative value. This occurs because amplifier 20 serves as a differential crossing detector and begins to swing its output in a negative direction as soon as the voltage at terminal 22 reaches zero. The regenerative feedback provided by the feedback loop between output terminal 29 and input terminal 24 causes a negative-going transition to be applied to terminal 24 with a very short rise time. The extent to which the voltage thus swings is then very sharply and precisely limited and held to a negative value established by the clipping action of bridge 48. The abrupt negative-going swings at output terminal 29 and at non-inverting terminal 24 are shown respectively as the leading edge 68 of waveform C in FIG. 2 and the leading edge 70 of the waveform in FIG. 2B.

At the same time as the voltage at output terminal 29 swings from positive to negative, diode 34, being then forward biased into conduction, permits charge transfer to capacitor 54 from feedback capacitor 32. Consequently, the voltage at input terminal 22 then abruptly again goes negative by an amount $\Delta e$. The latter has a magnitude which is equal to the ratio of the capacitances of capacitors 32 and 54 times the peak-to-peak value ($V_1$) of the output voltage at terminal 29 (as shown in waveform C of FIG. 2). The abrupt negative swing of the voltage at input terminal 22 is shown in waveform A of FIG. 2 as transition 72 having an amplitude of $\Delta e$. The voltage at terminal 22, having dropped to $-\Delta e$, then begins to ramp up again (as shown in portion 74 of waveform A of FIG. 2) as capacitor 54 again begins to discharge. At the same time, as capacitor 54 begins to discharge, both feedback capacitors 32 and 30, and capacitor 46 also begin to charge. Preferably, capacitor 46 is 20 or more times larger than capacitor 30, e.g., capacitor 30 will be 5pf, capacitor 46 will be 100 pf and resistor 44 will be 20K.Ω

The voltage at pin 24 then decays in a positive direction, but at a faster rate than the rate at which capacitor 54 discharges. The slope of ramp 74 in waveform A of FIG. 2 associated with the charging of capacitor 54 is set by the value of the latter. The discharge slope of capacitors 30 and 46, (shown as curve 76 in waveform B of FIG. 2), is established mostly by the RC time constant determined by the values of capacitor 46 and resistor 44 inasmuch as there is a substantial disparity in the value of capacitances between capacitors 46 and 30. Inasmuch as the time constants for the two curves 76 and 74 are different (curve 74 being shown superimposed in waveform B as the dotted line) the voltages at terminals 22 and 24 decay at different rates until ultimately they reach approximately the same value. Amplifier 20, then again acting as a differential crossing detector, will by virtue of the regenerative feedback loop, very abruptly swing the voltage on terminal 24 to a positive value. The positive going transition in waveform C is shown at 76. If the action of the bilateral voltage limiter represented by bridge 48 is symmetrical, the peak positive value of the voltage on terminal 29 is equal to the peak value of the negative transition 68 of waveform C of FIG. 2. When the output of amplifier 20 swings in the positive direction, diode 38 becomes biased in the forward direction permitting current flow between terminal 29 and ground to charge capacitor 32. The voltage on terminal 24 will again start to decay from its positive value towards zero according to the time constants established by capacitors 46 and 30 and resistor 44. This negative going decay slope, which is equal and opposite to that of curve 76, is shown at 80.

As shown in waveforms of FIG. 2, the cycle will begin again when the voltage at input terminal 22 to amplifier 20 again reaches zero causing a regenerative feedback which drives the voltages at both terminals 22 and 24 again sharply negative. Consequently, the signal at output terminal 29 will swing alternatively negatively and positively with extremely sharp rise times due to the regenerative feedback around amplifier 20. The extent to which that signal swings is limited by the clipping action of bridge 48 so that the output voltage shown in waveform C of FIG. 2 is a rectangular waveform in which the period T is a function of the values of feedback capacitor 32, the value of input resistor 42, the peak-to-peak voltage $V_1$ set by limiter 48 and the value of the input signal $e_t$. Of these foregoing parameters, $e_t$ is of course, the independent function and all of the other values can be set with a high degree of precision.

The foregoing can be seen by simple consideration of the relationships involved. For example, we can define the input current I at terminal 22 as $$I = e_t/R \qquad (1)$$

where $R$ is the value of resistance 50. Of course, if $I$ itself is to be the input to the system rather than $e_t$, input resistor 50 can be dispensed with.

It is also apparent that $$I = CFV_2 \qquad (2)$$

where $F$ is the output frequency, $C$ is the capacitance of feedback capacitor 32, and $V_2$ is equal to the difference between the peak-to-peak value $V_1$ and the voltage at junction 33, i.e., $V_2$ is the peak-to-peak voltage across capacitor 32. The value $V_2$ can be trimmed by adjustment of potentiometer 40.

Lastly, as is well known, $$Q = CV_2 \qquad (3)$$

where $Q$ is the charge on capacitor 32. To establish $Q$ with high precision, it is only necessary then to select a precision capacitor for capacitor 32 inasmuch as the voltage limiting action of bridge 48 establishes the value of $V_2$ with the desired precision. Combining these three equations then by substitution, one finds that $$e_t = RQF \text{ or } e_t = KF \qquad (4)$$

$K$ being a constant determined by selected values of R and Q. The output frequency of repetition rate is therefore a precise linear function of the input voltage. Typically, the input signal $e_i$ can readily vary from zero to 10 volts with a commensurate change in the frequency at the output of the system from zero to 10 KHz.

It will be apparent that the voltage at terminal 22 should start at some initially negative value in order for the system to go into oscillation. Hence, it is useful to provide the device with a startup circuit, such as that shown in FIG. 3. The circuit of FIG. 3 comprises a pnp transistor, $Q_1$, the emitter of which is connected to input terminal 22 of amplifier 20, and the collector of which is connected to some source of negative voltage. The base of transistor $Q_1$ is connected through an input impedance such as resistor 86 to output terminal 29 of the circuit of FIG. 1. An RC filter formed of capacitor 88 and resistor 89 is connected between the base of transistor $Q_1$ and system ground.

The simple circuit of FIG. 3 essentially operates in the following manner. If the emitter of transistor $Q_1$ is positive with respect to the base, then transistor $Q_1$ will be in conduction. Hence, the negative voltage at the collector of the transistor will be applied, neglecting the transistor drop, to terminal 22, bringing the latter to a negative potential. The system of FIG. 1 then begins to oscillate. By selecting the circuit constants of the embodiment of FIG. 1 so that the positive portion of each output cycle is greater than the negative portion, the filter circuit formed of capacitor 88 and resistor 89 will keep the base of transistor $Q_1$ positive during operation of the converter. This action of the filter on the base of transistor $Q_1$ serves to keep transistor $Q_1$ off. Hence, the startup circuit only functions to provide a negative pulse of voltage to input terminal 22 to start the oscillations of the circuit of FIG. 1 and is turned off thereafter.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. An amplitude-to-frequency converter comprising, in combination;

a differential amplifier having an ac coupled regenerative feedback loop and a degenerative feedback loop comprising a charge storage impedance connected to the output of said amplifier and first unilateral current conducting means connected between said impedance and an inverting input of said amplifier, charge storage means connected between said inverting input and system ground; and means for limiting the peak-to-peak voltage output from said amplifier.

2. A converter as defined in claim 1 wherein said charge storage impedance and charge storage means are capacitive, and said unilateral current conducting means comprises diode means.

3. A converter as defined in claim 2 including an input resistance connected to said inverting input.

4. A converter as defined in claim 1 including a second unilateral current conducting means disposed in series between said charge storage impedance and system ground, and being poled, with respect to said charge storage impedance, oppositely to said first unilateral current conducting means.

5. A converter as defined in claim 4 including a current source for providing a bias current at the junction of said first and second unilateral current conducting devices.

6. A converter as defined in claim 1 wherein said regenerative feedback loop includes a capacitive impedance.

7. A converter as defined in claim 1 wherein said means for limiting comprises a bilateral voltage limiter connected to the output of said amplifier.

8. A converter as defined in claim 7 wherein said voltage limiter comprises a diode bridge.

9. A converter as defined in claim 1 including means for introducing an initial starting potential to said inverting input.

* * * * *